United States Patent [19]

Wanlass

[11] Patent Number: 5,319,260
[45] Date of Patent: Jun. 7, 1994

[54] APPARATUS AND METHOD TO PREVENT THE DISTURBANCE OF A QUIESCENT OUTPUT BUFFER CAUSED BY GROUND BOUNCE OR BY POWER BOUNCE INDUCED BY NEIGHBORING ACTIVE OUTPUT BUFFERS

[75] Inventor: Frank M. Wanlass, Sunnyvale, Calif.

[73] Assignee: Standard Microsystems Corporation, Hauppauge, N.Y.

[21] Appl. No.: 964,490

[22] Filed: Oct. 20, 1992

Related U.S. Application Data

[63] Continuation of Ser. No. 734,752, Jul. 23, 1991, abandoned.

[51] Int. Cl.⁵ ............................................. H03K 17/16
[52] U.S. Cl. .................................... 307/443; 307/451; 307/473
[58] Field of Search .............. 307/443, 263, 451, 585, 307/448, 473, 304

[56] References Cited

U.S. PATENT DOCUMENTS

| | | | |
|---|---|---|---|
| 4,217,535 | 8/1980 | Suzuki | 307/304 |
| 4,622,482 | 11/1986 | Ganger | 307/585 |
| 4,638,187 | 1/1987 | Boler et al. | 307/451 |
| 4,777,389 | 10/1988 | Wu et al. | 307/443 |
| 4,785,201 | 11/1988 | Martinez | 307/443 |
| 4,820,942 | 4/1989 | Chan | 307/443 |
| 4,825,101 | 4/1989 | Walters | 307/263 |
| 4,942,312 | 7/1990 | Stevens | 307/304 |
| 4,961,010 | 10/1990 | Davis | 307/443 |
| 4,990,802 | 2/1991 | Smooha | 307/443 |
| 5,003,205 | 3/1991 | Kohda | 307/443 |
| 5,015,873 | 5/1991 | Hirayama | 307/443 |
| 5,036,222 | 7/1991 | Davis | 307/443 |
| 5,057,711 | 10/1991 | Lee | 307/443 |
| 5,073,727 | 12/1991 | Shizu | 307/443 |
| 5,079,439 | 1/1992 | Wanlass | 307/443 |
| 5,146,112 | 9/1992 | Ito | 307/443 |

Primary Examiner—Eugene R. LaRoche
Assistant Examiner—A. Zarabian
Attorney, Agent, or Firm—Thomas E. Schatzel

[57] ABSTRACT

A CMOS device having many output channels at least one of which channel includes a first pair of pull-up/pull-down of transistors between a "noisy Vcc and noisy ground", a second pair of pull-up/pull-down of transistors between a "quiet Vcc and quiet ground", and logic to switch the transistor pairs such that initial switching of an output is powered by the noisy Vcc and ground, and maintenance of an output state is powered by the quiet Vcc and ground. Quiescent channels are decoupled from active channels and will hold their assigned output levels.

6 Claims, 2 Drawing Sheets

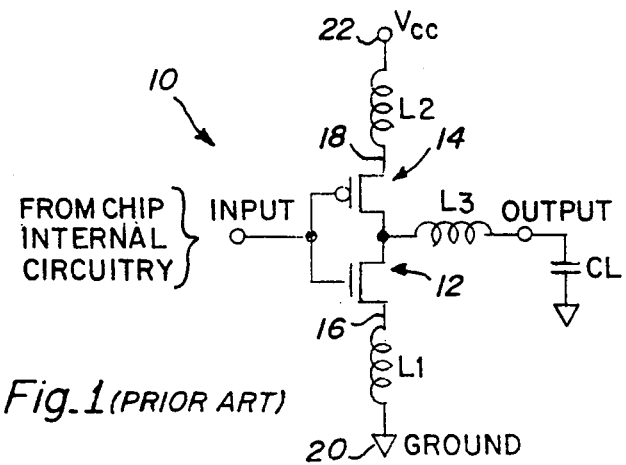
Fig_1 (PRIOR ART)
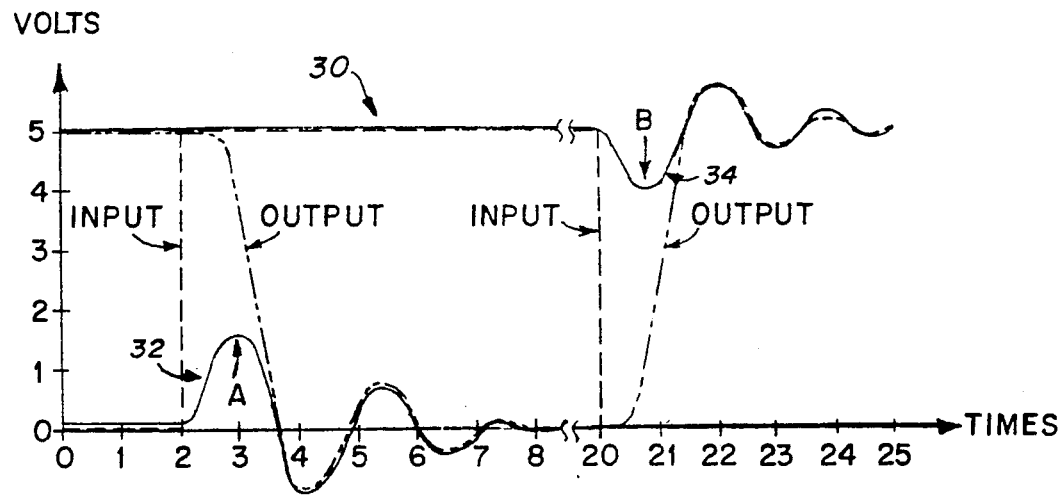
Fig_2 (PRIOR ART)
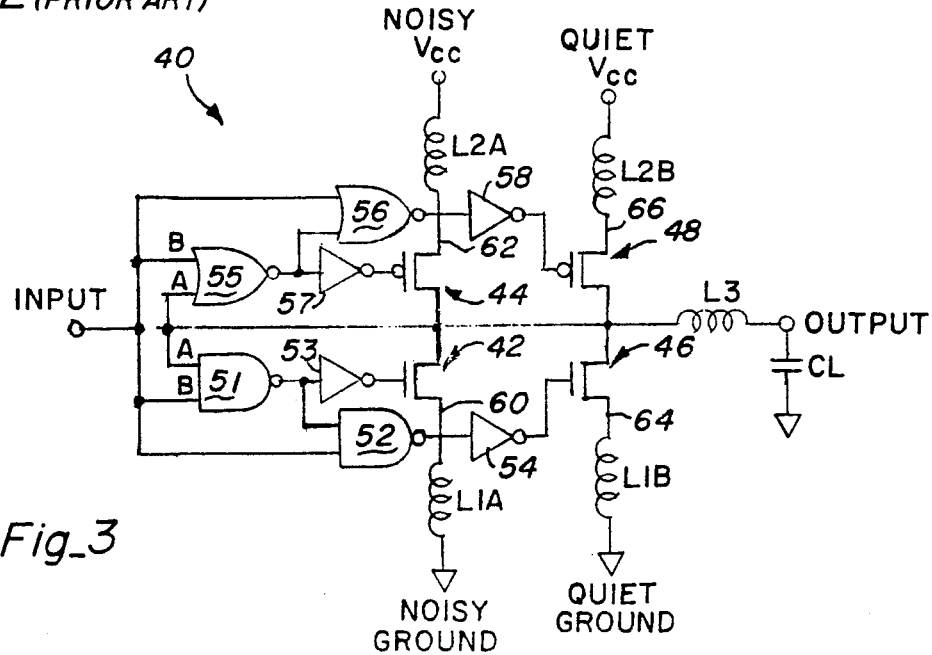
Fig_3

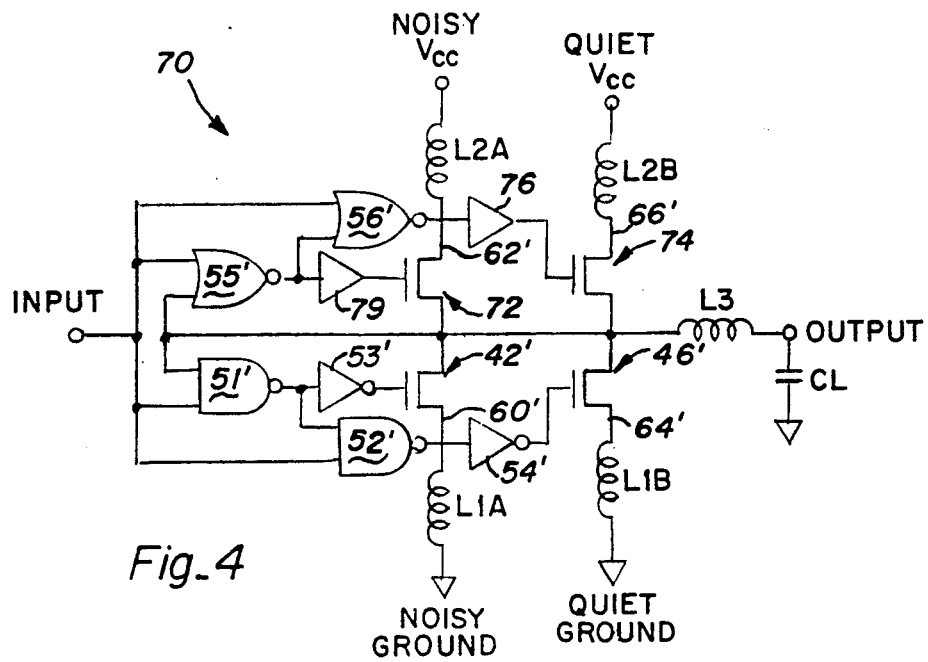
Fig_4
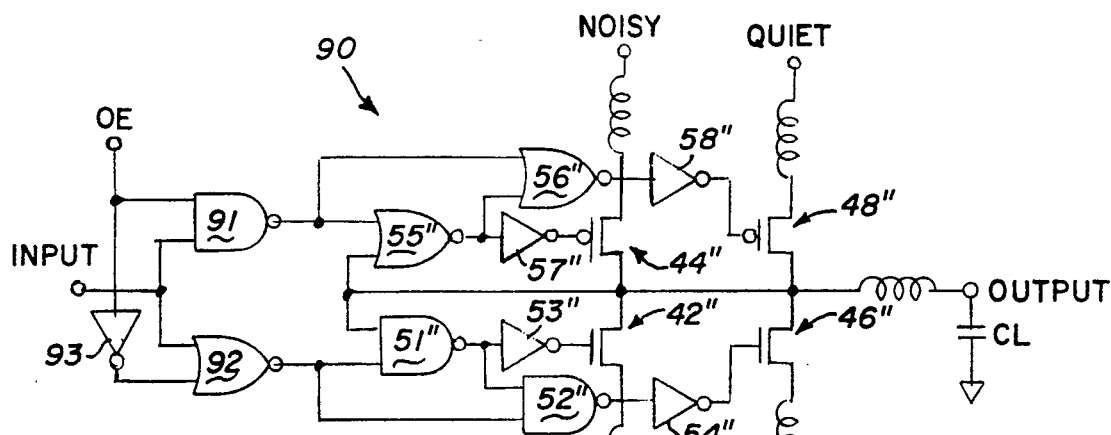
Fig_5
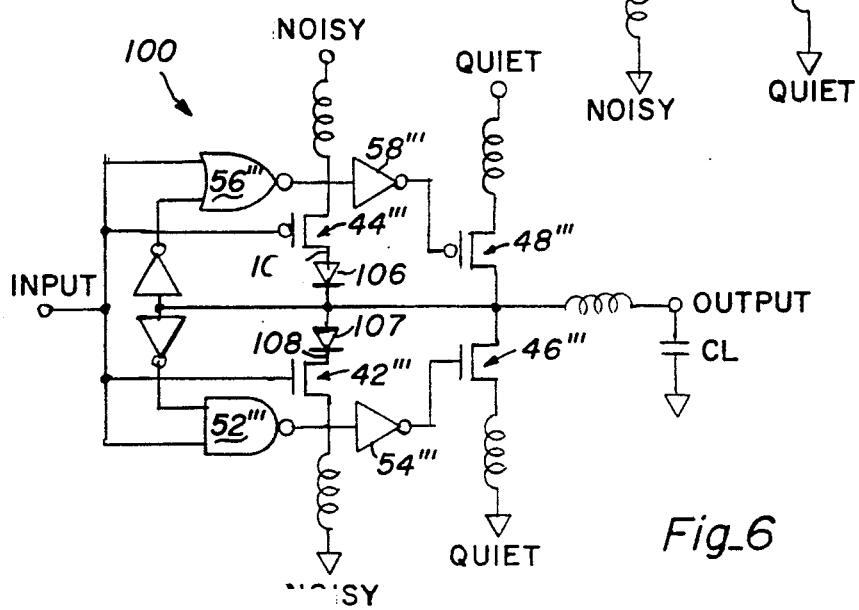
Fig_6

APPARATUS AND METHOD TO PREVENT THE DISTURBANCE OF A QUIESCENT OUTPUT BUFFER CAUSED BY GROUND BOUNCE OR BY POWER BOUNCE INDUCED BY NEIGHBORING ACTIVE OUTPUT BUFFERS

This is a continuation of copending application Ser. No. 07/734,752 filed on Jul. 23, 1991, abandoned.

BACKGROUND OF THE INVENTION

1. Field of the Invention

The invention relates generally to integrated CMOS (Complimentary Metal Oxide Semiconductor) circuits, and more particularly to circuit design techniques which reduce output ringing in very fast CMOS output buffers.

2. Description of the Prior Art

The need for increasing levels of throughput and improved performance in CMOS systems requires high speed and high dynamic drive current for CMOS output buffers that transfer signals from chip to circuit board or to back planes. This high speed and high drive can be easily achieved by modern submicron CMOS processing, but there are a few undesirable side effects.

With current technology, all internal chip nodes can slew very fast, resulting in a higher rate of change of current (di/dt) in all switching transistors. Since output devices are designed large to handle high levels of dynamic current, their di/dt rates can be very high. Chips that have several outputs switching simultaneously can have a total di/dt in the common ground or power lead inductances of over 500 mA/ns, and can develop large transient potential differences between the chip power traces and the external power connections. (The term "lead" inductance refers to the series combination of bonding wire, package pin inductance and inductance of the metal power bussing on the chip itself.)

FIG. 1 shows a prior art CMOS output driver arrangement comprising a buffer 10. Package lead inductances are represented as equivalent inductances L1, L2 and L3. An external load capacitance, $C_L$, is typically 50 picofarads (pfd). In Order to construct a high-speed driver, an NMOS transistor 12 and a PMOS transistor 14 should be sized large enough to dynamically sink or source about 100 milliamps. A typical high-speed CMOS chip will have many such drivers that all share common on-chip power and ground rails, e.g., nodes 16 and 18. A particular area of concern is the case where most of the outputs simultaneously switch from logic HIGH to LOW by turning on transistors 12. This will generate a voltage fluctuation of the on-chip node 16 ground compared to an external system ground 20. This condition is commonly known as "ground bounce". Also, when many outputs simultaneously switch from LOW to HIGH by turning on transistors 14, there will be a "Vcc bounce" of node 18.

FIG. 2 shows some representative "bounce" signals 30 on nodes 16 (waveform 32) and 18 (waveform 34) when many buffer circuits 10 are switching simultaneously. The major problem caused by these bounce signals is that they can feed through to the outputs of any quiescent buffers sharing nodes 16 and 18. If a quiescent buffer is supposed to have its output at ground, it will, instead, have an output signal that looks like waveform 32 having a pulse amplitude "A". Likewise, if a quiescent buffer is supposed to have its output at Vcc, it will, instead, have an output signal that looks like waveform 34 having a pulse amplitude "B". If amplitudes A and B are large enough, the supposedly quiescent outputs can falsely trigger any inputs to other chips they are driving downstream.

The prior art has attempted to correct these kinds of ground and supply bounce problems. Different approaches have been tried, but all have achieved less than a complete solution. The most common workaround solution is to slow down the rate of change of the Vgs voltage driving the gates of transistors 12 and 14 by inserting an appropriate delay network between the buffer's input and the transistors. If the gate drive to the transistors 12 and 14 is slowed down enough, amplitudes A and B, in FIG. 2, will be reduced. However, in order to have a significant bounce reduction, a buffer driving a fifty picofarad load might have to slow its throughput delay from two nanoseconds to eight nanoseconds. The exact amount of slowdown required depends on the package pin inductance and the number of outputs that could be switching simultaneously. A delay that is long enough for a case when all outputs are switching, will be excessive for cases when fewer than that number are switching. With some devices now having more than 32 outputs, the bounce solution chosen can have a major influence on a device's high-speed performance.

A common technique employed to control ground bounce involves distributing the current running through pull-down devices. Multiple pull-down devices each handle a reduced portion of the whole current and are successively turned on via a delay chain. Consider the prior art found in U.S. Pat. No. 4,785,201 by Martinez. The circuit of Martinez uses a P-type Metal Oxide Semiconductor (PMOS) pull-up transistor and a N-type Metal Oxide Semiconductor (NMOS) pull-down transistor as a pair of strong driving elements. (The parasitic, but "unavoidable series inductance to system ground" is shown as a discrete inductor, and a matching inductor to $V_{cc}$.) A PMOS pull-up transistor and a NMOS pull-down transistor form a pair of weak driving elements. The weaker pair are designed to turn on prior to the stronger pair via delays introduced by a pair of inverter transistors. The main idea is that the large current spike created when a large lumped device is turned on will be decreased in intensity if a previously activated weaker device dissipates some of the initial discharge energy. The gain of the stronger devices can be slightly lower than would otherwise be required. The United States Patent of Boler et U.S. Pat. No. 4,638,187, avoids using a PMOS pull-down as a weaker device, and instead uses another NMOS pull-down transistor. This weaker pull-down transistor has a smaller gain than the main NMOS pull-down. The delay is introduced by an R-C network that includes a resistor (and stray capacitance), instead of an inverter chain. U.S. Pat. No. 4,777,389, by Wu et al., discloses a circuit that essentially uses the same current distribution as above, but uses a different method of achieving the delay for the second, stronger pull-down transistor. The delay in turning on the second, stronger pull-down transistor results from a closed loop control that waits for the high-to-low transition of the output to reach a certain level before a pull-down transistor is activated. This assures an adequate time spacing between the two current spikes. None of the prior art above directly monitor or control the particular electrical parameter that results in ground bounce, namely, the time rate of change of the pull-down current (di/dt). The sensitivities to process, temperature, and operating voltage also go largely neglected. The U.S. Pat. No. 4,622,482, of Ganger, directs itself to limiting the output voltage slew rate in telecommunications applications. A pair of fixed capacitors, and a pair of constant current sources, are each used to perform slew rate limiting and to insure linearity. Several undesirable consequences result from the implementation. Biasing circuits are required to provide N-bias and P-bias potentials, thereby requiring an accurate source externally and therefore extra I/O pins. Alternatively, internally generated biases would necessitate generators with large static DC currents to sustain a reasonable noise rejection ratio. A complementary pair of push-pull transistors and are never mutually exclusive because their gates are not pulled completely up to Vdd or down to Vss when intended to be off. This results in large leakage currents that are usually unacceptable in digital circuits. And since the push-pull transistors are never quite off, parasitic capacitive coupling in their gates to Vdd and Vss will cause the push-pull transistors to amplify any high-frequency noise on the Vdd and Vss supply rails. Slew-rate control is confined only to the saturation region of the output transistors when static biasing is used. Since the value of capacitors do not change to accommodate the push-pull transistors transition from their saturation region to their linear region, the linearity control fails at this stage and throughout the linear region of operation. The capacitive coupling provided by capacitors will couple any output transition back to the gate of the supposedly off transistor to cause it to turn on. While the resulting current contention has the effect of further limiting the voltage slew rate of the output, it inadvertently dumps even more transient and DC current to Vss, which actually increases ground bounce in digital circuits.

Lien, et al., in U.S. Pat. No. 4,933,574, disclose a BiCMOS output driver that is intended to maximize switching speed and to minimize ground bounce. A bipolar transistor in the output is not permitted to go into saturation. A pair of transistors, connected in an inverter configuration, develop a signal that indicates when the bipolar transistor pulls-down the output below a predetermined point. Three gate delay times after the output falls below a second predetermined level, a second transistor in parallel with the bipolar transistor is switched.

The prior art has more-or-less been directed at controlling ground bounce for channels that are actively switching their outputs from high-to-low. The popular technique, described above, is to use two output pull-down transistors to ease up on the rate of output slew from high-to-low. What is needed is a solution that addresses the problem of quiescent channels that are already low and become unsettled by local ground bounce induced by a neighboring output channel. The present invention provides such a solution.

SUMMARY OF THE PRESENT INVENTION

It is therefore the object of the present invention to provide a circuit that eliminates ground or power bounce generated by simultaneous switching of active output buffers from feeding through quiescent output buffers, without having to slow down the buffer's signal delay.

Briefly, a first embodiment of the present invention is a CMOS device having many output channels at least one of which channel comprises a first pair of pull-up/pull-down of transistors between a "noisy Vcc and noisy ground", a second pair of pull-up/pull-down of transistors between a "quiet Vcc and quiet ground", and logic to switch the transistor pairs such that initial switching of an output is powered by the noisy Vcc and ground, and maintenance of an output state is powered by the quiet Vcc and ground. Quiescent channels are decoupled from active channels and will hold their assigned output levels.

An advantage of the present invention is that ground bounce peaks are effectively reduced and false triggering in nearby associated circuits is reduced or completely eliminated.

Another advantage of the present invention is large output sink currents ($I_{OL}$) can be obtained without exacerbating ground bounce.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a circuit diagram of a prior art CMOS buffer;

FIG. 2 is a plot of the voltage waveforms associated with the circuit of FIG. 1;

FIG. 3 is a circuit diagram of the first embodiment of the present invention;

FIG. 4 is a circuit diagram of the second embodiment of the present invention having NMOS source followers;

FIG. 5 is a circuit diagram of the third embodiment of the present invention that can tri-state its outputs; and FIG. 6 is schematic of a fourth embodiment of the present invention with diodes between the output and a pair of output transistors.

DETAILED DESCRIPTION OF THE PREFERRED EMBODIMENTS

As illustrated in FIG. 3, a buffer 40 comprises a first pair of pull-up/pull-down of transistors 42 and 44 between a "noisy Vcc and noisy ground", a second pair of pull-up/pull-down of transistors 46 and 48 between a "quiet Vcc and quiet ground", and logic 51-58 to switch the transistor pairs such that initial switching of an output is powered by the noisy Vcc and ground, and maintenance of an output state is powered by the quiet Vcc and ground. The two large NMOS pull down devices 42 and 46 have their drains tied together, and are in turn tied to the drains of the two large PMOS pull-up devices 44 and 48. All four drains connect to the output terminal of buffer 40 through the (package) inductance L3. If buffer 40 is to be able to drive, e.g., 50 pF at high-speed, then all four transistors should be large enough to dynamically sink or source about 100 milliamps. The gate of transistor 42 is driven by inverter 53, which is driven by NAND gate 51 which has as inputs the Input to buffer 40 and the Output of buffer 40. The output of NAND gate 51 also drives one input of NAND gate 52, which has as its other input buffer 40 Input. The output of NAND gate 52 drives inverter 54 which drives the gate of transistor 46. The gate of transistor 44 is driven by inverter 57, which is driven by NOR gate 55 which has as inputs the Input to buffer 40 and the Output of buffer 40. The output of NOR gate 55 also drives one input of NOR gate 56, which has as its other input buffer 40 Input. The output of NOR gate 56 drives inverter 58 which drives the gate of transistor 48.

The source of transistor 42 is connected to node 60. Typically there will be many other output buffers sharing node 60. Node 60 is connected to a "noisy ground" through inductance L1A. (Where L1A is the series inductance of the package leadframe, the bonding wire, and the on chip metal bussing.) In a similar manner, transistor 46 connects to node 64 and to a "quiet ground" through L1B, with typically many other output buffers sharing node 64. The source of transistor 44 connects to node 62 and to a "noisy Vcc" through L2A, with node 62 typically shared by many buffers. The source of transistor 48 connects to node 66 and to a "quiet Vcc" through L2B, with node 66 typically shared by many buffers.

In operation, if the Input to buffer 40 is brought high when the Output of buffer 40 is high, both NOR gates 55 and 56 will go low, and inverters 57 and 58 will go high turning off both transistor 44 and transistor 48. Also, the output of NAND gate 51 will go low and the output of inverter 53 will go high. Transistor 42 will then start to pull the output low by sinking current into the "noisy ground". During this Output high-to-low transition, transistor 46 will be off, because its gate is driven low by inverter 54, whose input is driven high by NAND gate 52. Once the Output becomes low, the output of the NAND gate 51 will go high, and the output of inverter 53 will go low, turning off transistor 42. NAND gate 51 going high also causes NAND gate 52 to go low, and inverter 54 to go high, turning on transistor 46, and connecting buffer 40 Output to the "quiet ground".

Now if the Input to buffer 40 is brought low when buffer 40 Output is low, both NAND gates 51 and 52 will go high, and inverters 53 and 54 will go low turning off both transistor 42 and transistor 46. Also, the output of NOR gate 55 will go high and inverter 57 will go low; transistor 44 will then start to pull the Output high by sourcing current from the "noisy Vcc". During this Output low-to-high transition, transistor 48 will be off, because its gate is driven high by inverter 58, whose input is driven low by NOR gate 56. Once the Output becomes high, the output of NOR gate 55 will go low, and the output of inverter 57 will go high turning off transistor 44. NOR gate 55 going low also causes NOR gate 56 to go high and inverter 58 to go low, turning on transistor 48, and clamping buffer 40 Output to the "quiet Vcc".

In the design of buffer 40, NAND gate 51 should have the sizes of its NMOS transistors much larger than its PMOS transistors, so that it switches its output when its "A" input is at a low level of, e.g., less than 1.5 volts. NOR gate 55 preferably has the sizes of its PMOS transistors set much larger than its NMOS transistors, so that it switches its output when its "A" input is at a higher level of, e.g., 3.5 volts. Inverter 54 preferably has its PMOS transistor small enough to turn on transistor 46 slowly, with a rise time of, e.g., 10 nSec. This minimizes the risks of putting any noise into the "quiet ground" path. Likewise, inverter 58 preferably has its NMOS transistor fairly small to minimize the chance of putting noise into the "quiet Vcc".

In a p-well CMOS process, transistors 42 and 46 can be in separate wells, allowing a substrate connection of transistor 42 to node 60, and the substrate connection of transistor 46 to connect to node 64. In such a process, transistors 44 and 48 will be in a common n-type substrate, and it would be best to tie this to node 66.

In an n-well process, transistor 42 and transistor 46 will be in a common p-type substrate, and this can be tied to node 64. In this process, transistors 44 and 48 can be in separate wells, allowing separate substrate connections to nodes 62 and 66.

FIG. 4 shows a second embodiment of the present invention, a buffer 70, where the large PMOS pull-up transistors are replaced by large NMOS transistors 72 and 74. Buffer 70 is similar to buffer 40, except inverters 57 and 58 are replaced by non-inverting buffers 79 and 76, because it takes a positive gate voltage to turn on the NMOS pull-up transistors 72 and 74, rather than the negative voltage for the PMOS transistors 44 and 48. (A non-inverting buffer can be made by putting together two inverters.) Here, for an n-well process, all of the large NMOS transistors will be in the same p-type substrate, which can be tied to node 64'. For a p-well process, each large NMOS transistor can have its own well tied to its source; this is expected to give the best isolation between noisy and quiet channels.

FIG. 5 illustrates a tri-state output buffer 90, according to a third embodiment of the present invention. Buffer 90 is similar to buffer 40, with the addition of NAND gate 91, NOR gate 92, and inverter 93. Output enable (OE) is the enable signal to take buffer 90 in and out of tri-state condition. When output enable (OE) is low, the output of NAND gate 91 will be high, and the output of NOR gate 92 will be low. Following through the logic paths to the large output devices, it is seen that they will all be turned off. Similarly, buffer 70 could be converted to tri-state operation with the addition of gates 91 and 92, and inverter 93 at the input.

Eventually a noisy ground will have to connect to a quiet ground, and a noisy Vcc will have to connect to a quiet Vcc. Many modern high-speed semiconductor packages have two or more ground pins and two or more Vcc pins. For these packages, the "noisy" pins can be kept separate from the "quiet" pins, and can be connected externally wherever the system designer desires, such as to ground or power planes in a multilayer printed circuit board (PCB). For many older package formats there is only one ground and one Vcc pin. Here it would be best to design the inside of the package such that there are separate "Noisy" and "Quiet" traces from the chip to the package Ground and Vcc pins.

FIG. 6 illustrates a fourth embodiment of the present invention which is a buffer 100 comprised of a PMOS pull-up transistor 44''' having drain 104 tied through Schottky diodes 106 and 107 to drain 108 of a large NMOS pull-down transistor 42'''. Transistors 44''' and 42''' are powered by the noisy Vcc and noisy ground. A second pair of transistors 46''' and 48''' are connected to the quiet Vcc and quiet ground. The output load of buffer 100 is represented, as above, by a capacitive load $C_L$ of approximately fifty picofarads. The principal difference between buffer 40 and buffer 100 is the addition of Schottky diodes 106 and 107 in the latter, instead of control logic 51, 53, 55, and 57. A Schottky diode type is preferred over an ordinary silicon diode type because the switching speed is faster and the forward bias voltage is lower for the Schottky diode. Forward bias voltages are on the order of a few hundred millivolts.

The action of Schottky diodes 106 and 107 helps keep a quiescent channel that is at a logic low or high from becoming unsettled in sympathy with nearby channels generating large ground bounce voltages. Schottky diode 107 will reverse bias, for example, beginning immediately with any movement of drain 108 of transistor 42''' toward Vcc, when the output is low. Likewise, diode 106 will reverse bias for any movement of drain 104 toward ground when the output is high.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A buffer with a single input, comprising:
   a first pull-up/pull-down transistor pair adapted for connection between a first ground reference and a first Vcc supply, the first pull-up/pull-down transistor pair having means for driving an output of the buffer;
   a pair of diodes each diode in series with each transistor of the first pull-up/pull-down transistor pair and in series with the output of the buffer;
   a second pull-up/pull-down transistor pair adapted for connection between a second ground reference which is isolated from said first ground reference and a second Vcc supply which is isolated from said first Vcc supply, the second pull-up/pull-down transistor pair having means for driving said buffer output; and
   a logic network connected to an input of the buffer and with means to control the first and second pull-up/pull-down transistor pairs such that the first pull-up/pull-down transistor pair initially switches said buffer output from high-to-low and low-to-high, the second pull-up/pull-down transistor pair thereafter clamping said buffer output.

2. The buffer of claim 1, wherein:
   the pair of diodes comprise Schottky diodes.

3. A p-well process type integrated circuit having a plurality of buffers, each buffer comprising:
   a first pull-up/pull-down transistor pair for connection between a first ground reference and a first Vcc supply, the first pull-up/pull-down transistor pair coupled for driving an output terminal, the first pull-down transistor being an NMOS type transistor and having its wall tied to its source;
   a second pull-up/pull-down transistor pair for connection between a second ground reference and a second Vcc supply, the second pull-up/pull-down transistor pair coupled for driving said output terminal, said second ground reference and said second Vcc supply are isolated from said first ground reference and said first Vcc supply within the integrated circuit and have separate corresponding pins on the integrated circuit for external connection, the second pull-down transistor being an NMOS type transistor having its well tied to its source wherein isolation is improved between said first ground reference, said first Vcc supply said second ground reference and said second Vcc supply;
   logic means for controlling the first pull-up/pull-down transistor pair such that initial switching of said output terminal is powered by said first ground reference and said first Vcc supply, and such that maintenance of said output terminal at a HIGH or LOW state is powered by said second ground reference and said second Vcc supply, wherein the switching of one buffer within the integrated circuit will not disturb the output state of another, quiescent buffer within the integrated circuit; and
   a pair of diodes one each connected in series between said output terminal and each of the pull-up transistor and the pull-down transistor in the first transistor pair.

4. The integrated circuit of claim 3, wherein:
   the pair of diodes comprise Schottky diodes.

5. A p-well process type CMOS integrated circuit having a plurality of buffers, each buffer comprising:
   a first pull-up/pull-down transistor pair for connection between a first ground reference and a first Vcc supply, the first pull-up/pull-down transistor pair coupled for driving an output terminal, the first pull-down transistor being an NMOS type transistor and having its well tied to its source;
   a second pull-up/pull-down transistor pair for connection between a second ground reference and a second Vcc supply, the second pull-up/pull-down transistor pair coupled for driving said output terminal, said second ground reference and said second Vcc supply are isolated from said first ground reference and said first Vcc supply within the integrated circuit and have separate corresponding pins on the integrated circuit for external connection, the second pull-down transistor being an NMOS type transistor disposed in a p-well separate from a p-well in which the first pull-down transistor is disposed, and having its well tied to its source wherein isolation is improved between said first ground reference, said first Vcc supply, said second ground reference and said second Vcc supply;
   logic means for controlling the first pull-up/pull-down transistor pair such that initial switching of said output terminal is powered by said first ground reference and said first Vcc supply, and such that maintenance of said output terminal at a HIGH or LOW state is powered by said second ground reference and said second Vcc supply, wherein the switching of one buffer within the integrated circuit will not disturb the output state of another, quiescent buffer within the integrated circuit; and
   a pair of diodes one each connected in series between said output terminal and each of the pull-up transistor and the pull-down transistor in the first transistor pair.

6. The integrated circuit of claim 5, wherein:
   the pair of diodes comprise Schottky diodes.

* * * * *